US006867422B1

(12) United States Patent
Ito et al.

(10) Patent No.: US 6,867,422 B1
(45) Date of Patent: Mar. 15, 2005

(54) APPARATUS FOR ION IMPLANTATION (75) Inventors: Hiroyuki Ito, Narita (JP); Hiroshi Asechi, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/830,631

(22) PCT Filed: Oct. 29, 1999

(86) PCT No.: PCT/JP99/06038

§ 371 (c)(1),
(2), (4) Date: Apr. 29, 2002

(87) PCT Pub. No.: WO00/26938

PCT Pub. Date: May 11, 2000

(30) Foreign Application Priority Data

Oct. 30, 1998 (JP) .......................................... P10-310658

(51) Int. Cl.[7] ............................................ H01J 37/317
(52) U.S. Cl. .................................. 250/492.21; 250/251
(58) Field of Search ............................. 250/492.21, 251

(56) References Cited

U.S. PATENT DOCUMENTS

| | | | | |
|---|---|---|---|---|
| 5,343,047 A | * | 8/1994 | Ono et al. ............. | 250/492.21 |
| 5,378,899 A | * | 1/1995 | Kimber .................. | 250/492.21 |
| 5,668,368 A | * | 9/1997 | Sakai et al. ............ | 250/492.21 |
| 5,909,031 A | * | 6/1999 | Kellerman et al. .... | 250/492.21 |

FOREIGN PATENT DOCUMENTS

| | | |
|---|---|---|
| JP | 04 073847 | 3/1992 |
| JP | 6-13019 | 1/1994 |
| JP | 6-51100 | 2/1994 |
| JP | 6-267439 | 9/1994 |

OTHER PUBLICATIONS

Office Action for Korean Patent Application No. 2001–7005121, Nov. 14, 2003.

* cited by examiner

*Primary Examiner*—Kiet T. Nguyen
(74) *Attorney, Agent, or Firm*—Moser, Patterson & Sheridan, L.L.P.

(57) ABSTRACT

An ion implantation apparatus comprises an ion source section (18) for generating ions; an ion implantation section (14) for implanting the ions generated in the ion source section (18), in a substrate (92); a charged particle generator (62) for generating charged particles having a charge opposite to that of the ions; a beam guide section (24) having an inlet aperture (24a) for accepting the ions from the ion source section (18), an outlet aperture (24b) for delivering the ions into the ion implantation section (18), a guide tube (24c) extending from the inlet aperture (24a) to the outlet aperture (24b), and an introducing section (80) having an opening (82) thereof in an internal surface (24d) of the guide tube (24c), for introducing the charged particles from the charged particle generator (62) into the guide tube (24c); and a shield section (84) located between the opening (82) of the introducing section (80) and the outlet aperture (24b) inside the guide tube (24c). A shield surface (84a) of the shield section (84) blocks the charged particles' reaching the wafer.

6 Claims, 6 Drawing Sheets

APPARATUS FOR ION IMPLANTATION

TECHNICAL FIELD

The present invention relates to ion implantation apparatus and, more particularly, to ion implantation apparatus that can prevent a substrate from being contaminated by contaminant particles from a charged particle generator.

BACKGROUND ART

Large-current ion implantation apparatus performs ion implantation with an ion beam having a large current value in order to introduce a number of ions per unit time into a substrate. For this reason, the substrate itself is gradually charged up during execution of the ion implantation. If this charge build-up results in discharge, the substrate can be damaged by the discharge. In order to avoid such an accident, a charge neutralizer is used to prevent the charge build-up on the substrate. The charge neutralizer generates electrons for relieving the damage due to the charge of the substrate, whereby the negative charge of the electrons neutralizes the positive charge of ions to be implanted.

DISCLOSURE OF THE INVENTION

However, the charge neutralizer is constructed to heat a filament by supplying an electric current thereto in order to generate the electrons, and thus not only the electrons but also metal particles making the filament jump out of the heated filament. If such metal particles reach the substrate, they will cause an unwanted effect on devices to be formed on the substrate in many cases. For this reason, the charge neutralizer becomes one of contamination sources for the substrate.

An object of the present invention is to provide an ion implantation apparatus that can reduce such metal contamination.

An ion implantation apparatus according to the present invention comprises an ion source section for generating ions; an ion implantation section for implanting the ions generated in the ion source section, in a substrate; a charged particle generator for generating charged particles having an opposite charge to that of the ions; a beam guide section having an inlet aperture for accepting the ions from the ion source section, an outlet aperture for delivering the ions to the ion implantation section, a guide tube extending from the inlet aperture to the outlet aperture, and an introducing section having an opening thereof in an internal surface of the guide tube, for introducing the charged particles from the charged particle generator into the guide tube; and a shield section located between the opening of the introducing section and the outlet aperture inside the guide tube.

In this structure, the beam guide section for the ions generated in the ion source section to pass toward the ion implantation section is provided with the charged particle generator for generating the charged particles having the opposite charge to that of the ions. Therefore, this charged particle generator also generates contaminant particles of contaminating matter for the substrate. However, since the shield section located between the opening of the introducing section and the outlet aperture is provided inside the guide tube, it can block paths of flight of contaminant particles jumping out through the opening of the internal wall of the guide tube and reaching the substrate.

In the ion implantation apparatus according to the present invention, the shield section may have a shield surface intersecting with straight lines running from points on a surface specified by the opening of the introducing section to points on a surface of the substrate to be implanted, placed in the ion implantation section.

With provision of this shield surface, it blocks paths of contaminant particles jumping out through the opening of the internal wall of the guide tube and directly arriving at the substrate.

In the ion implantation apparatus according to the present invention, the shield section may have a shield surface extending from the vicinity of the edge of the opening to above the opening.

When the shield section is provided with the shield surface extending from the vicinity of the edge of the opening to above the opening as in this structure, the shield section of the simple structure blocks paths of contaminant particles jumping out of the opening of the internal wall of the guide tube and directly arriving at the substrate in the ion implantation section.

In the ion implantation apparatus according to the present invention, the shield section may have a shield surface intersecting with straight lines running from points on a surface specified by the opening of the introducing section to points on a surface specified by the outlet aperture of the ion beam section.

With provision of this shield surface, the shield surface blocks paths of contaminant particles jumping out though the opening of the introducing section and directly arriving at the substrate, even in the middle of movement of a substrate at the position facing the outlet aperture.

In the ion implantation apparatus according to the present invention, the shield section may have the shield surface making an acute angle with the internal wall surface of the guide tube and having a flat plate shape. The shield section may be configured to include a flat plate having the shield surface and placed at an acute angle to the internal wall surface of the guide tube, and a frame member for supporting this flat plate.

BEST MODE FOR CARRYING OUT THE INVENTION

A preferred embodiment of the present invention will be described hereinafter with reference to the drawings. The same portions will be denoted by the same reference symbols and redundant description will be omitted, as much as possible.

Figure 1:
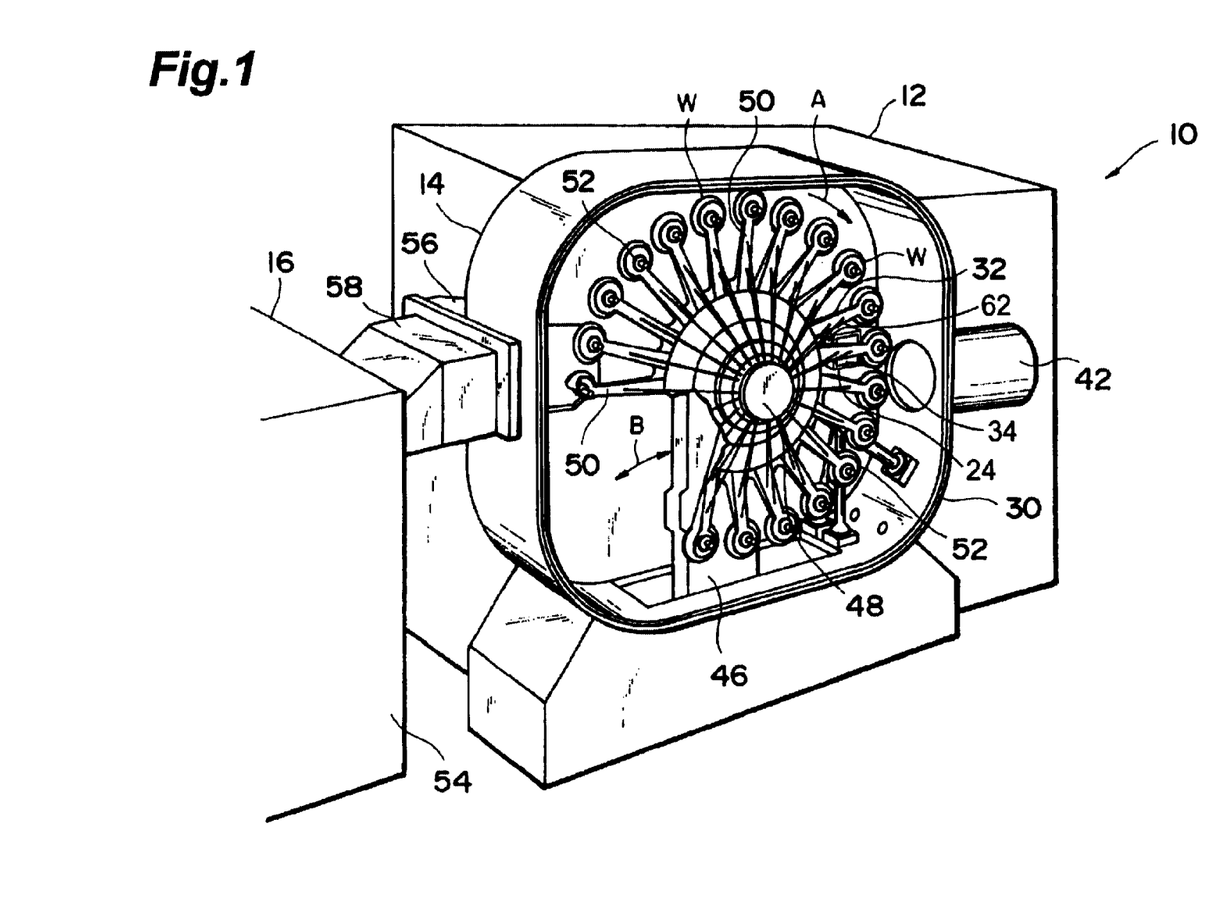
FIG. 1 is an exploded perspective view to show an ion implantation apparatus according to the present invention.
Figure 2:
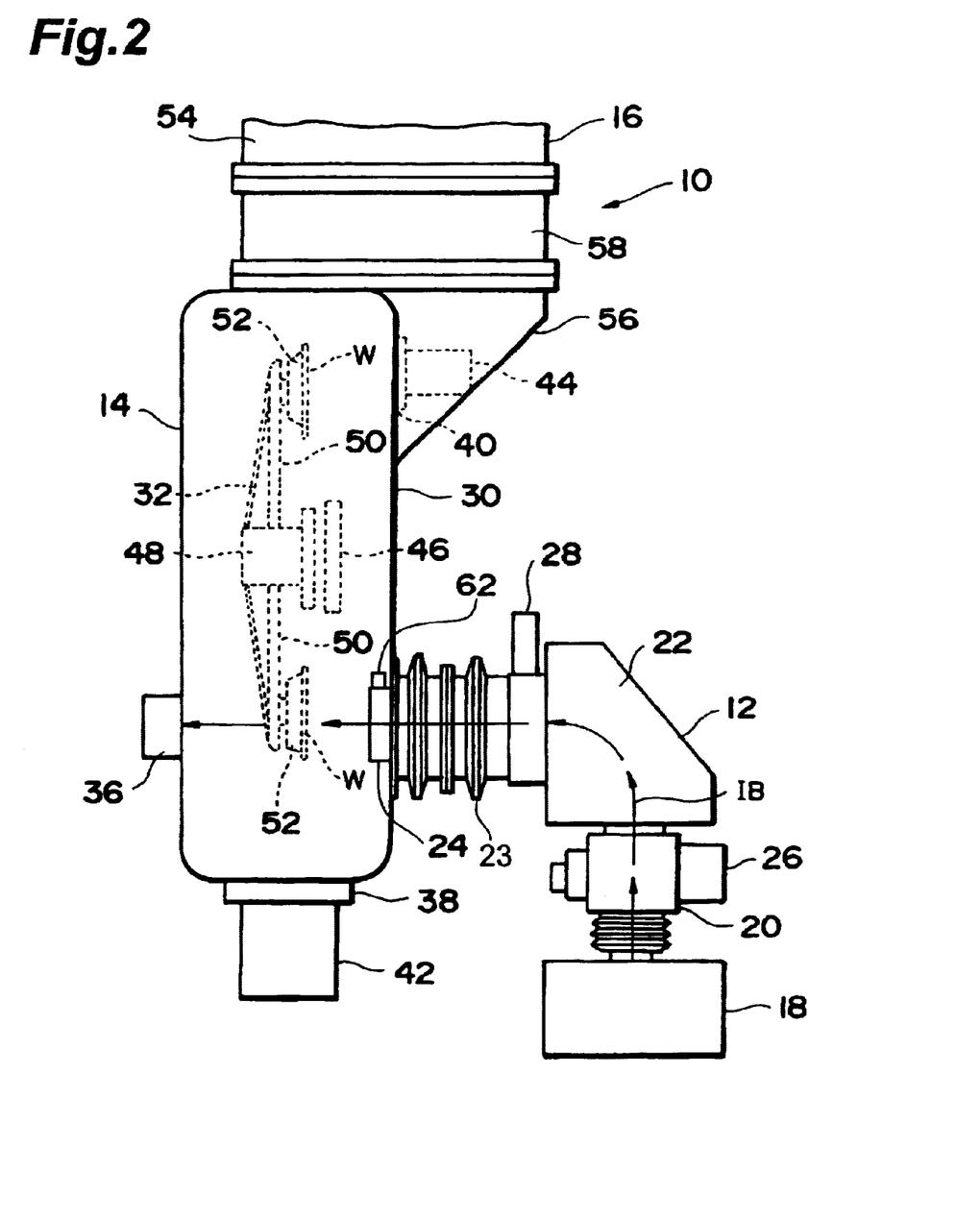
FIG. 2 is a schematic structural diagram of the ion implantation apparatus according to the present invention.

The ion implantation apparatus 10 according to the embodiment of the present invention will be described referring to FIG. 1 and FIG. 2. FIG. 1 is an exploded perspective view to show the preferred embodiment of the ion implantation apparatus according to the present invention. FIG. 2 is a schematic structural diagram of the ion implantation apparatus of the present embodiment.

Referring to FIG. 1 and FIG. 2, the ion implantation apparatus 10 is mainly comprised of an ion source section 12, an ion implantation section 14, and a beam guide section 24.

The ion source section 12 generates ions to form an ion beam (IB). Wafers (substrates) W are placed in the ion implantation section 14, and the ions generated in the ion source section 12 are implanted in the wafers W. The beam guide section 24 has an inlet aperture for accepting the ions, connected to the ion source section 12 (more precisely, to a postacceleration system 23 described hereinafter), an outlet aperture as an opening to the ion implantation section 14, for delivering the ions thereinto, and a guide tube extending from the inlet aperture to the outlet aperture.

The ion source section 12 has an ion generating system 18, an ion beam extraction preacceleration system 20, a mass analyser system 22, and a postacceleration system 23. Each of these systems is housed in a housing or a tube (pipe). Vacuum pumps as pressure reducing means, e.g., turbo molecular vacuum pumps 26, 28 are connected to the ion beam extraction preacceleration system 20 and to the postacceleration system 23, respectively. For this reason, the interior of each of the ion beam extraction preacceleration system 20 and the postacceleration system 23 is depressurized to a predetermined vacuum.

The ion generating system 18 is able to produce a high density plasma including doping ions by inducing discharge in a gas containing a doping impurity supplied from a gas supply source (not illustrated). The ion beam extraction preacceleration system 20 extracts the doping ions from the plasma in the ion generating system 18 by making use of a potential difference from the ion generating system 18 and accelerates the doping ions to form the ion beam (IB). A magnet for mass analysis (not illustrated) is disposed in the mass analyser system 22. Therefore, only ion species determined by the kinetic energy acquired in the ion extraction preacceleration system 20 and the magnetic field of the mass analysis magnet are taken out of the ion source section 12. After taken out of the ion source section 12, the ion beam (IB) is further accelerated while passing the postacceleration system 23. The ion beam acquires predetermined kinetic energy (acceleration energy) suitable for the ion implantation before arrival at the beam guide section 24.

The beam guide section (tube) 24 is connected at the inlet aperture to the postacceleration system 23. The beam guide section 24 accepts the ions through this inlet aperture and delivers the ions through the outlet aperture opening opposite to the ion implantation section 14. The ions are injected into the wafer W in the ion implantation section 14.

On the other hand, the ion implantation section 14 is provided with a target chamber 30 of a box type, and a wafer support wheel 32 disposed in the target chamber 30.

The guide section 24 is located on one wall surface of the target chamber 30 so that an opening 34 of the beam guide section 24 connected at one end thereof to the postacceleration system 23 can face the wafer W. The beam guide section 24 projects with the opening 34 being directed into the target chamber 30. A beam stop 36 is located at a position opposite to the opening 34 in another wall surface. The beam stop 36 is a stop for receiving the ion beam (IB) having passed the wafer support wheel 32, and an ion detector for detecting an ion beam irradiation amount is located there for controlling the ion implantation. Vacuum pumps as second pressure reducing means, for example, cryopumps 42, 44 are connected each through a valve 38, 40 on the wall surface of the target chamber 32 to the ion implantation section 14.

The wafer support wheel 32 consists of a swing shaft 46 mounted in a swingable state in the target chamber 30, a hub 48 mounted in a rotatable state to the distal end of the swing shaft 46, and a plurality of arms 50 radially extending from the hub 48. A wafer holder 52 for holding a wafer W is provided at the distal end of each arm 50. The hub 48 is driven to rotate in a direction of an arrow A illustrated in FIG. 1 and the swing shaft 46 is swung in a predetermined angle range along directions of arrows B illustrated in FIG. 1.

A wafer loader section 16 is disposed adjacent to the target chamber 30. In the wafer loader section 16, a transfer path 56 keeps a housing 54 and the target chamber 30 in communication with each other. This transfer path 56 is provided with an isolation valve 58 to separate the housing 54 from the target chamber 30. This allows only the wafer loader 16 to be opened to the atmosphere, so that an operator can place a cassette (not illustrated) accommodating a plurality of wafers W, in the housing 54. The wafers W in the cassette can be transferred and mounted on the respective wafer holders 52 of the wafer support wheel 32 in the target chamber 30 by a robot (not illustrated).

Figure 3:
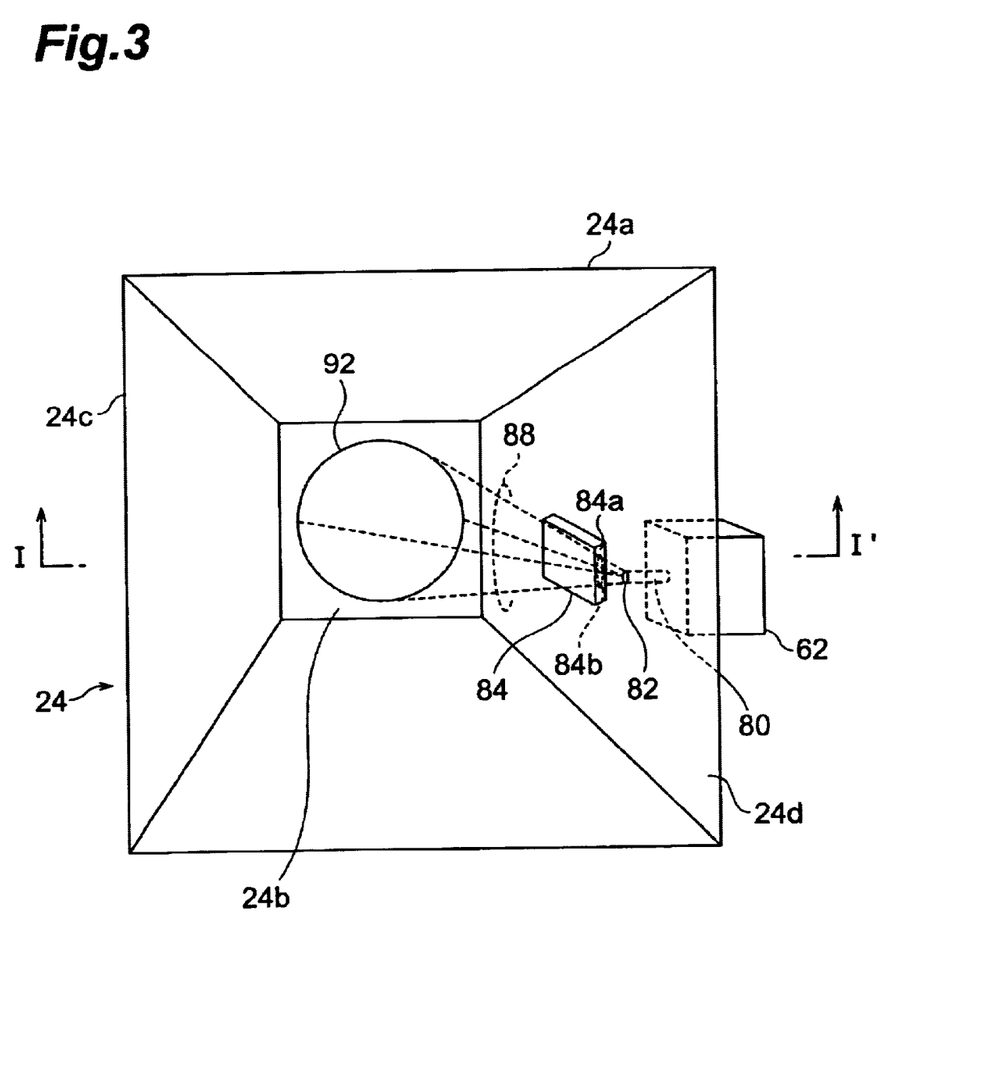
FIG. 3 is a perspective view of the interior of the beam guide section obtained when the outlet aperture is viewed from the inlet aperture.
Figure 4:
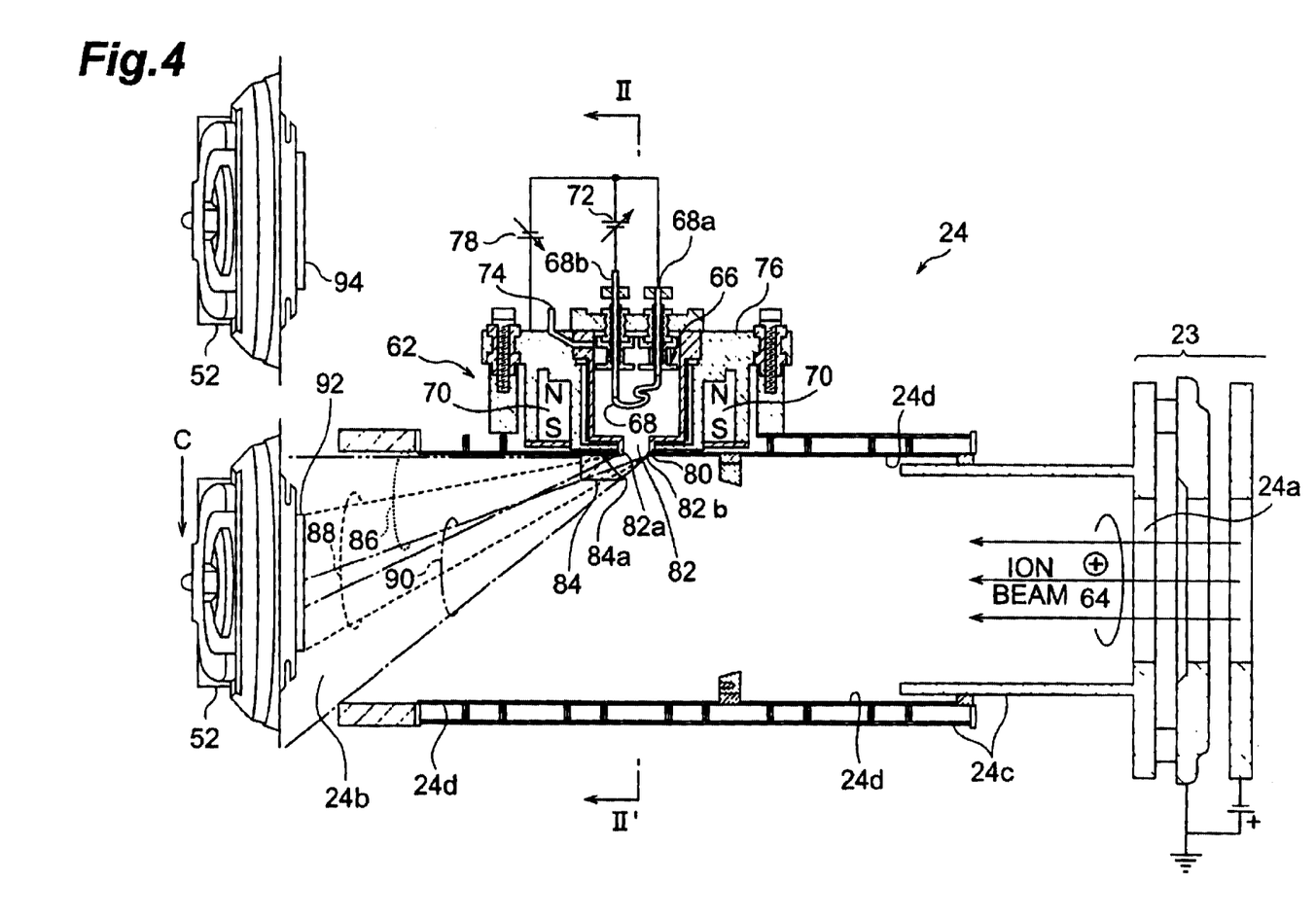
FIG. 4 is a longitudinal cross-sectional view as a cross section along I–I' of FIG. 3, which schematically depicts the beam guide section in a plane including an axis directed in the traveling direction of the ion beam.
Figure 5:
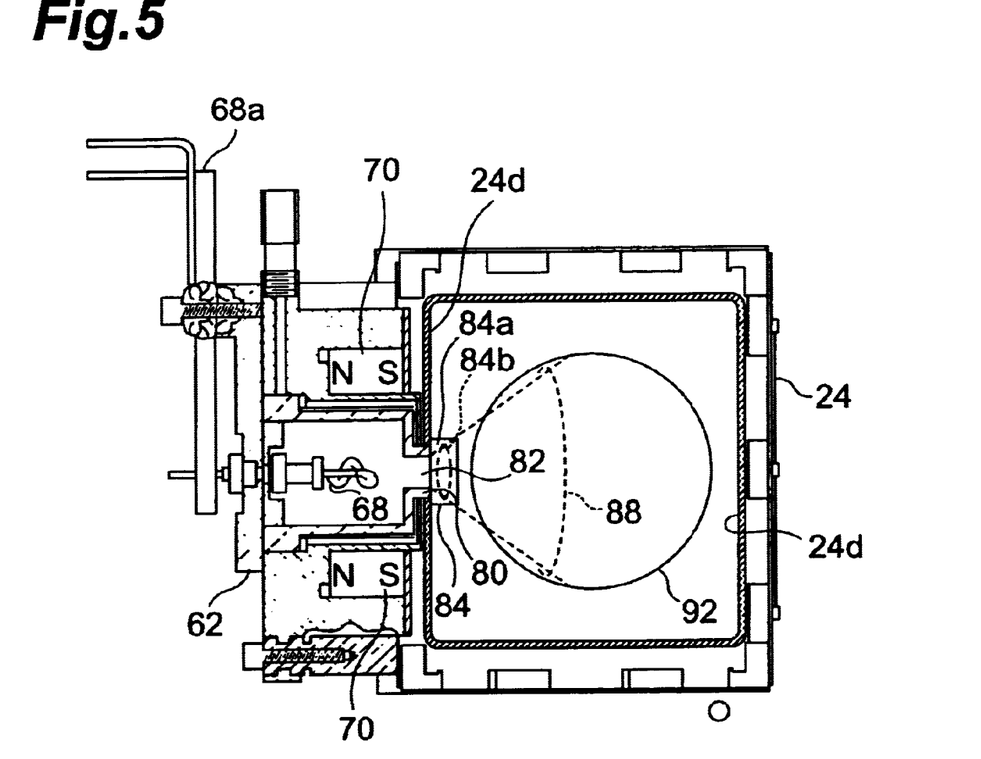
FIG. 5 is a cross-sectional view as a cross section along II–II' of FIG. 4.

The beam guide section 24 will be described referring to FIG. 3 to FIG. 5. FIG. 3 is a perspective view of the interior of the beam guide section 24 as a view of outlet aperture 24b from inlet aperture 24a. FIG. 4 is a cross-sectional view as a cross section along I–I' of FIG. 3. FIG. 4 is the cross-sectional view to schematically show the beam guide section 24 in a plane including the axis directed in the traveling direction of the ion beam. FIG. 5 is a cross-sectional view as a cross section along II–II' of FIG. 4.

In the beam guide section 24, the inlet aperture 24a is connected to the postacceleration system (denoted by numeral 23 in FIG. 2) of the ion source section and the outlet aperture 24b has the opening 34 in communication with the interior of the ion implantation section (denoted by numeral 14 in FIG. 2). The inlet aperture 24a and outlet aperture 24b are connected by a guide tube 24c extending from the inlet aperture 24a to the outlet aperture 24b. Therefore, the interior of the guide tube 24c is a passage for the ion beam 64 to pass, and the ions having passed through the guide tube arrive at the wafer 92. The wafer 92 is mounted on a wafer holder 52. Similarly, wafers 94 are mounted on other wafer holders 52. These wafers rotate at high speed in the plane normal to the direction of the traveling axis of the ion beam 64. Since this arrangement causes these wafers 92, 94 to successively move relative to the ion beam (in the direction of an arrow C in FIG. 4), the ions are repeatedly implanted in these wafers 92, 94.

A charged particle generator 62 is disposed on an outer side surface of the beam guide section 24. This charged particle generator 62 is disposed in the target chamber 30. The charged particle generator 62 includes a filament coil 68 having two terminals, a plasma generating chamber 66 housing the filament coil 68, and a plasma intensifying magnet 70 for intensifying the plasma generated in the plasma generating chamber 66. The two terminals 68a, 68b of the filament coil 68 are drawn out in an electrically insulated state from one surface of the plasma generating chamber 66 to the outside of the chamber to be connected to a power supply 72. The power supply 72 is, for example, one having the dc voltage of 5 volts and the current supply capacity of 200 amperes.

In order to generate the plasma in the plasma generating chamber 66, a filler gas, e.g., argon gas is supplied through a gas supply tube 74 to the plasma generating chamber 66. Since the electric current flowing in the filament coil 68 heats the filament itself, the filament coil 68 emits thermoelectrons into the plasma generating chamber 66. A power supply 78 is connected between the filament coil 68 and a peripheral part 76 of the chamber 66 so that the chamber 66 side has a higher potential than the filament coil 68. The power supply 78 is, for example, one having the dc voltage of 50 volts and the current supply capacity of 6 amperes. When the filament coil 68 comes to emit thermoelectrons, the plasma is generated in the chamber 66 to increase electrons emitted from the filament. Therefore, the charged particle generator 62 is an electron generator and thus has the function of a charge neutralizer.

An introducing tube (introducing section) 80 connects the plasma generating chamber 66 with the beam guide section 24. The introducing tube 80 has its opening 82 in the internal wall 24d of the guide tube 24c, so that the charged particles from the charged particle generator 62 are guided through this opening 82 into the guide tube 24c. For this reason, part of the thermoelectrons generated pass through the introducing tube 80 because of diffusion thereof to be released into the beam guide section 24. A typical shape of such an opening 82 is a circle or an ellipse and the typical size thereof is 3 mm to 5 mm in the diameter passing the center.

Meanwhile, the filament 68 heated by the electric current also emits particles of a metal material making the electrode, as well as the thermoelectrons. In the charged particle generator 62 of the ion implantation apparatus, the filament 68 is made of tungsten. Therefore, the charged particle generator 62 also emits tungsten atoms together with electrons. If the tungsten atoms were introduced into the silicon wafer, they could cause an unwanted effect on semiconductor devices. Therefore, it is necessary to employ a means for preventing the tungsten atoms from reaching the wafer.

For this purpose, the ion implantation apparatus 10 of the present embodiment is provided with a shield section 84. The shield section 84 is located between the opening 82 of the introducing tube 80 and the outlet aperture 24b on the internal wall surface 24d of the guide tube 24c.

The following will describe the reason why this shield section 84 is suitable for prevention of contamination of wafers. The charged particle generator 62 for generating the charged particles having the charge opposite to that of the ions is provided in the beam guide section 24 through which the ions generated in the ion source section 18 (see FIG. 2) pass to be introduced into the ion implantation section 14 (see FIG. 2). For this reason, the charged particle generator 62 also generates the contaminant particles (tungsten atoms of the constituent element making the filament) which are contaminants for the wafers. However, when the shield section 84 located between the opening 82 of the introducing tube 80 and the outlet aperture 24b is placed on the internal wall 24d of the guide tube 24a, it blocks paths of particles jumping out through the opening 82 of the internal wall 24d of the guide tube and directly reaching the wafer 92. Therefore, the shield section prevents the tungsten atoms from contaminating the wafers.

In the example illustrated in FIG. 4, the paths to be blocked are only those of the particles jumping out through the opening 82 and directly reaching the wafer 92. Concerning it, the inventor considers the reason as follows. In general, the interior of the beam guide section 24 of such ion implantation apparatus is maintained in high vacuum. The reason is that the vacuum in which the ions of the ion beam 64 rarely collide with remaining gas, needs to be achieved in order to permit very large part of the ion beam 64 entering through the inlet aperture 24a to reach the outlet aperture 24b. When the beam guide section 24 is maintained in such a vacuum, the probability of the particles colliding with the ion implantation apparatus or the wall surface 24d of the beam guide section 24 or the like is greater than the probability of the particles therein colliding with each other. Accordingly, though the tungsten atoms jumping out through the opening 82 have velocities in various directions, the tungsten atoms, particularly, with velocity vectors directed toward the wafer 92, specifically, with velocity vectors within dashed lines 88 in the example of FIG. 4 can directly reach the surface of the wafer 92 unless they collide with other particles. The particles with other velocity vectors have to change their directions of motion toward the wafer 92 by colliding with the wall surface 24d. This probability is small. It is thus sufficient to block the paths of the tungsten atoms jumping out through the opening 82 and directly reaching the wafer 92.

Referring to FIG. 4 and FIG. 5, the region between chain double-dashed lines 86 indicates a situation in which as a result of movement the wafer 92 has arrived at the position where the entire surface thereof appears in the outlet aperture 24b of the beam guide section 24. The region between dashed lines 88 indicates a situation in which after further movement the wafer 92 has arrived at the position where the entire surface thereof appears approximately in the center of the outlet aperture 24b of the beam guide section 24. The region between chain lines 90 indicates a situation in which after further movement the wafer 92 has arrived at the position where part of the surface thereof starts leaving the outlet aperture 24b of the beam guide section 24.

With examples of two typical points 82a, 82b on the periphery of the opening 82, the matter necessary for prevention of contamination of wafers will be further described. The point 82a is the closest point to the outlet aperture 24b out of those on the opening 82 and the point 82b the farthest point from the outlet aperture 24b out of those on the opening 82. A shield surface 84a of the shield section 84 intersects with at least part of a group of straight lines running from the point 82a to points on the surface of the wafer 92. Likewise, the shield surface 84a of the shield portion 84 intersects with at least part of a group of straight lines from the point 82b to points on the surface of the wafer 92. The tungsten atoms flying in paths indicated by the intersecting lines collide with the shield section 84, i.e., with the shield surface 84a before reaching the wafer surface. Therefore, such atoms do not reach the wafer surface.

The above described the typical points 82a and 82b, but a similar group of straight lines is also defined at each point on the opening surface specified by the opening 82. In order to prevent the contamination caused by the tungsten atoms, it is preferable to provide the shield surface 84a so that the shield surface 84a of the shield section 84 intersects with at least part of such straight line groups consisting of all the straight lines defined at the respective points as described above.

Particularly, in the cross section (plane) illustrated in FIG. 4, the shield surface 84a of the shield section 84 intersects with all the straight lines running from the point 82a to the respective points on the surface of the wafer 92. Similarly, the shield surface 84a of the shield section 84 intersects with all the straight lines running from the point 82b to the respective points on the surface of the wafer 92. The shield surface 84a also intersects with all the straight lines running from each of the points on the surface specified by the opening 82 to each of the points on the surface of the wafer 92.

FIG. 5 depicts a case in which the shield surface 84a intersects with all the straight lines running from all the points on the surface of the opening 82 to each point on the surface of the wafer 92, and an outline 84b defined by the group of these straight lines is illustrated on the shield surface 84a of the shield section 84. In this case, the contamination can be prevented almost perfectly.

The shield surface 84a will be described below in more detail.

The shield surface 84a is preferably a surface intersecting with the straight lines running from each of the points on the surface specified by the opening 82 of the introducing tube 80 to each of the points on the surface to be implanted in the wafer 92 placed in the ion implantation section 14. When such a shield surface 84a is placed, it blocks the paths of the contaminant particles jumping out through the opening 82 of the internal wall 24d of the guide tube and directly reaching the wafer 92.

The shield surface 84a is preferably shaped so as to extend from the vicinity of the edge 82a of the opening 82 to above the opening 82. By providing the shield surface 82a of this shape, the shield section 84 of the simple structure blocks the paths of the contaminant particles jumping out through the opening of the internal wall 24d of the guide tube and directly reaching the wafer in the ion implantation section 14.

Further, the shield surface 84a is preferably one intersecting with straight lines running from each of the points on the surface specified by the opening 82 of the introducing tube 80 to each of points on the surface specified by the outlet aperture 24b of the ion beam section 24. By providing the shield surface 84a of this type, the shield section blocks the paths of the contaminant particles jumping out through the opening 82 of the internal wall 24d of the guide tube and directly reaching the wafer 92 everywhere the wafer 92 moves across the outlet aperture.

Figure 6:
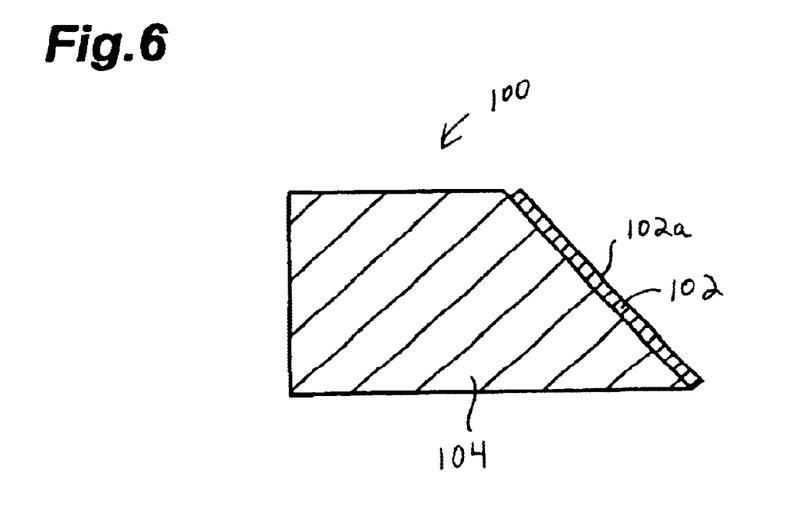
FIG. 6 is an alternative view of a shield section that replaces the shield section in FIG. 4.

The shield section 84 of this type can be a flat-plate-shape member which has the shield surface 84a at one end, the shield surface 84a making an acute angle with the wall surface 24d of the guide tube, and which extends in the direction of the ion beam 64 on the internal wall 24d as shown in FIG. 4. Alternatively, as shown in FIG. 6, a shield section 100 may also be constructed of a flat plate 102 one surface of which forms the shield surface 102a and which extends at an acute angle from the wall surface 24d, and a frame member 104 supporting the flat plate.

Referring to FIG. 3, the illustration includes only the beam guide section 24, the charge generating section 62, and the shield section 84 for simplicity. The opening 82 of the introducing tube 80 is located in the internal wall 24d of the beam guide section 24. The outline 84b of the group of straight lines connecting between the points on the opening 80 and the points on the wafer 92 is illustrated on the shield surface 84a of the shield section 84. Since the shield plane 84a is arranged to extend so as to cover the region from the edge of the opening 82 to above the opening 82 in this way, it can intersect with at least part of such a group of straight lines. The shield plane 84a is preferably formed so as to intersect with all the group of straight lines.

A material suitable for formation of such a shield section 84 is preferably graphite. As another example, the shield portion 84 is made of a predetermined material and thereafter it is coated with graphite by a surface coating treatment, thereby preventing the contamination.

The results of experiments will be presented below as to the ion implantation apparatus provided with the shield section 84 for shielding the filament 68 as described above. The ion implantation conditions employed for the experiments were as follows.

Ion species: As

Acceleration energy: 80 keV

Dose: $5 \times 10^{15}/cm^2$

Analysis was conducted to measure amounts of tungsten in substrates with or without the shield section 84 under the above conditions. This analysis was carried out by inductively coupled plasma mass spectrometry (ICP-MS). The experiment results were as follows:

before attachment of the filament shield: $2.4 \times 10^{12}$ atoms/$cm^2$;

after attachment of the filament shield: $1.6 \times 10^{10}$ atoms/$cm^2$.

The shield section 84 was provided so as to block the entire viewing angle range from the wafer to the opening in communication with the chamber housing the filament. As a result, the number of atoms of the contaminant element was reduced to below one tenth.

INDUSTRIAL APPLICABILITY

As detailed above, the ion implantation apparatus according to the present invention is constructed so that the charged particle generator is attached to the beam guide section through which the ion beam passes to be delivered to the ion implantation section. For this reason, the charged particle generator also generates the contaminant particles of contaminating matter for the substrate together with the charged particles having the charge opposite to that of the ions. However, since the shield section located between the opening of the introducing section and the outlet aperture is provided on the internal surface of the guide tube, it can block the paths of the contaminant particles jumping out through the opening of the internal wall of the guide tube and reaching the substrate. Therefore, the invention provides the ion implantation apparatus capable of preventing the substrate from being contaminated by the contaminant particles generated by the charged particle generator.

What is claimed is:

1. An ion implantation apparatus comprising:

an ion source section for generating ions;

an ion implantation section for implanting said ions generated in said ion source section, in a substrate, a charged particle generator for generating charged particles having a charge opposite to that of said ions, the charge particle generator including a filament coil and a plasma generating chamber housing the filament coil;

a beam guide section having an inlet aperture for accepting said ions from said ion source section, an outlet aperture for delivering said ions into said ion implantation section, a guide tube extending from said inlet aperture to said outlet aperture, and an introducing section having an opening thereof in an internal surface of said guide tube, for introducing said charged particles from said charged particle generator into said guide tube; and a shield section located between said opening of said introducing section and said outlet aperture, wherein the shield section has a portion adjacent the internal surface of said guide tube and the portion of the shield section is located at a position spaced away from said opening of said introducing section, and wherein said shield section comprises a shield surface making an acute angle with the internal surface of said guide tube.

2. The ion implantation apparatus according to claim 1, wherein said shield section comprises a shield surface intersecting with straight lines running from points on a surface specified by said opening of said introducing section to points on a surface of said substrate to be implanted with the ions, placed in said ion implantation section.

3. The ion implantation apparatus according to claim 2, wherein said shield surface has a flat plate shape.

4. The ion implantation apparatus according to claim 2, wherein said shield section comprises a flat plate having said shield surface, and a frame member for supporting said flat plate.

5. The ion implantation apparatus according to claim 1, wherein said shield section comprises a shield surface extending from the vicinity of the edge of said opening to above said opening.

6. The ion implantation apparatus according to claim 1, wherein said shield section comprises a shield surface intersecting with straight lines running from points on a surface specified by said opening of said introducing section to points on a surface specified by said outlet aperture of said beam guide section.

* * * * *